310-334 SR
8/19/80 XR 4,217,684

United States Patent [19] [11] 4,217,684
Brisken et al. [45] Aug. 19, 1980

[54] FABRICATION OF FRONT SURFACE MATCHED ULTRASONIC TRANSDUCER ARRAY

[75] Inventors: Axel F. Brisken, Ballston Lake; Lowell S. Smith, Schenectady, both of N.Y.

[73] Assignee: General Electric Company, Schenectady, N.Y.

[21] Appl. No.: 30,299

[22] Filed: Apr. 16, 1979

[51] Int. Cl.² .......... H01L 41/22
[52] U.S. Cl. .......... 29/25.35; 29/841; 29/840; 29/843; 310/334
[58] Field of Search .......... 29/25.35, 628, 418; 310/334, 367, 327; 128/660

[56] References Cited

U.S. PATENT DOCUMENTS 3,952,387 4/1976 Iinuma et al. .......... 29/25.35
4,101,795 7/1978 Fukomoto et al. .......... 310/336
4,118,649 10/1978 Shwartzman et al. .......... 29/25.35 X

OTHER PUBLICATIONS

"Multilayer Impedance Matching Schemes For Broadbanding of Water Loaded Pietoelectric Transducers", J. H. Goll et al., IEE Transactions on Sonics and Ultrasonics, vol. SU-22, No. 1, Jan. 1975, pp. 52-53.
"Highly Efficient Transducer Arrays Useful in Nondestructive Testing Applications", C. S. Desilets et al., 1978 Ultrasonic Symposium Proceedings.

*Primary Examiner*—Carl E. Hall
*Attorney, Agent, or Firm*—Donald R. Campbell; James C. Davis; Marvin Snyder

[57] ABSTRACT

A slab of piezoelectric ceramic plated on all surfaces is bonded to quarter wavelength impedance matching layers of glass and plastic. The top surface of the ceramic is slotted and parallel cuts orthogonal to the slots are made through the ceramic and into the glass to delineate an array of elements each with a signal electrode between slots and a wrap-around ground electrode. After making ground connections and flying lead connections to the signal electrodes, the matching layers are fully cut through from the front. A covering or wear plate is attached to the front surface and a relatively large mass of acoustic damping material covers the backs of the elements.

12 Claims, 12 Drawing Figures

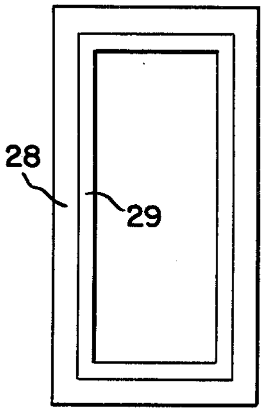
Fig. 6
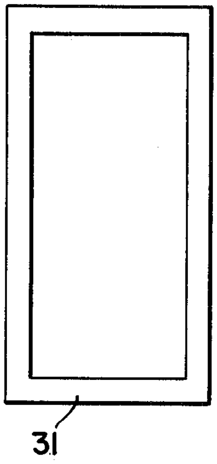
Fig. 7
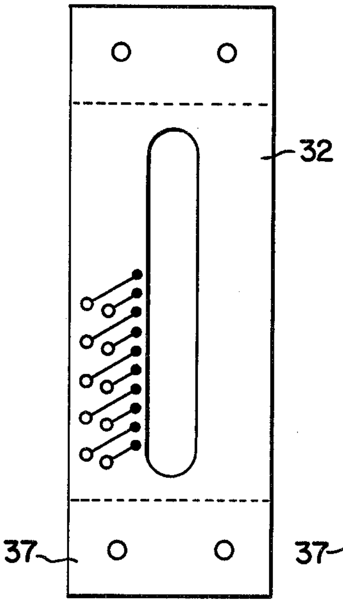
Fig. 8
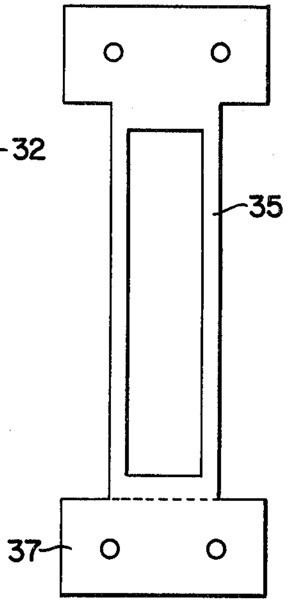
Fig. 9
Fig. 5
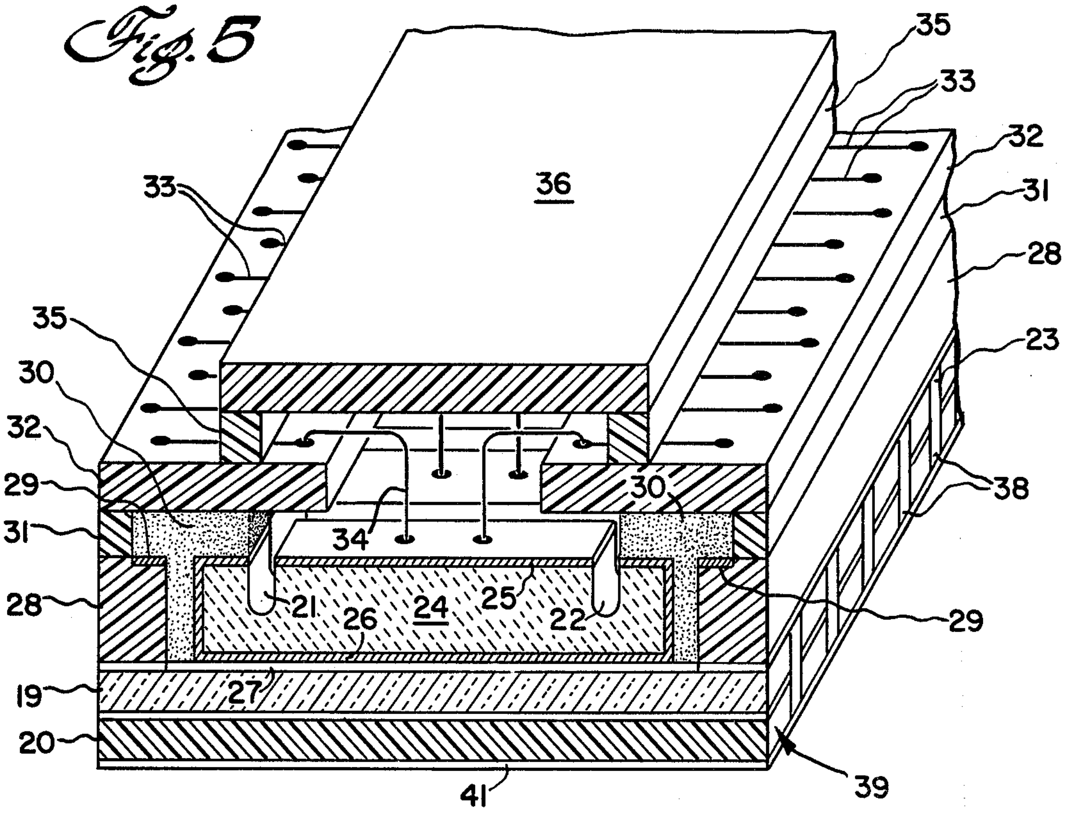

FABRICATION OF FRONT SURFACE MATCHED ULTRASONIC TRANSDUCER ARRAY

BACKGROUND OF THE INVENTION

This invention relates to ultrasonic transducer arrays and especially to a method of making a front surface matched array including electrical connections to the fully independent transducer elements.

A transducer array with high sensitivity and short impulse response for use in electronically steered beam imagers to make wide angle sector scans has a large number of piezoelectric ceramic elements and one or more quarter wavelength impedance matching layers on the front surface of each element. The matching layers as well as the ceramic are completely cut through so that the elements are supported on their ends and held together at the front by a continuous thin layer of tape and wear plate. This array configuration is disclosed and claimed in copending application Ser. No. 958,654, and the wear plate in application Ser. No. 958,655, both filed on Nov. 8, 1978 by the instant inventors and assigned to the same assignee as this invention.

Manufacturing the fragile front surface matched array, assembling it into a transducer head with sufficient mechanical strength for medical diagnostic examination or water tank testing, and making electrical connections to every individual element are not trivial problems. The piezoelectric elements are spaced on a grid with centers at sub-millimeter distances, and it is necessary to make separate signal lead and ground connections to the fully independent elements.

SUMMARY OF THE INVENTION

An illustrative method of fabricating an improved linear transducer array is performed by initially bonding together a laminate made up of a half wavelength thickness rectangular slab of piezoelectric ceramic, all six sides of which are plated with metal, and first and second quarter wavelength thickness impedance matching layers of glass and plastic. Two slots are cut partially into the plated ceramic near the side edges such that the distance between slots is equal to a designated element radiative length. First cuts are made parallel to the end edges of the ceramic orthogonal to the slots at a spacing equal to the element width; these cuts extend completely through the ceramic and partially into the first matching layer and delineate on the separate elements a signal electrode between the slots and a wrap-around ground electrode. A common electrical connection is made to all the ground electrodes of the array elements, as by a ground printed circuit board and a conductive filler material; a flying lead connection is made between every signal electrode and a signal printed circuit board mounted to project over the elements. The back of the array may be filled with a dielectric material to provide acoustical damping of the device and mechanical support. Second cuts are made through the matching layers aligned with the first cuts to completely separate the bonded together element and matching layer units. A continuous covering or wear plate is attached to the front of the matching layers and provides additional mechanical support for the array of acoustically uncoupled matched units; configurations for medical examination and water tank testing are given.

The preferred embodiment is an epoxy (or other acoustically lossy material) backed array; an air backed array is also possible. In the former, the epoxy backfill reduces the transducer element shock excitation ring down noise. Furthermore, the assembly is trimmed off to reduce the overall size in the direction of the length of the elements. A relatively large mass of epoxy is needed at the backs of the elements, and a substantial part of the space between the signal board and a multipin connector is also filled with epoxy. The lossy material makes it possible to get clearer images; any loss in sensitivity is minimized by choosing the material to have a low acoustic impedance as compared to the ceramic.

BRIEF DESCRIPTION OF THE DRAWINGS

FIG. 5 is a partial perspective of an air backed array pallet completed except for attaching a wear plate;

FIGS. 6–9 are plan views of printed circuit and insulating board components of the assembly in FIG. 5;

DESCRIPTION OF THE PREFERRED EMBODIMENTS

Figure 1:
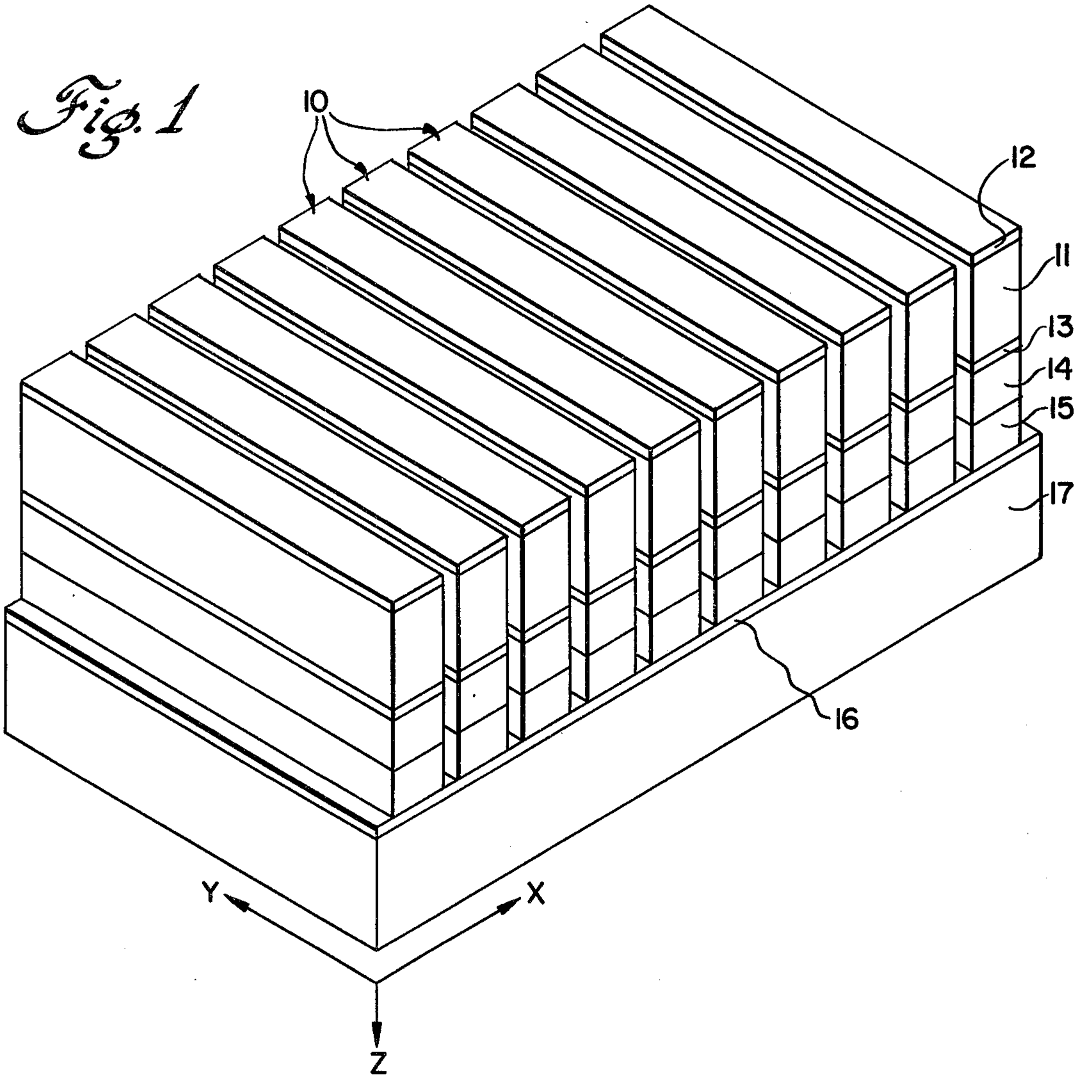
FIG. 1 is a partial perspective view of a front surface matched transducer array covered by a body contacting wear plate.

A front surface matched array in FIG. 1 is capable of performing wide angle sector scans with a total scan angle exceeding 60° using narrow transducer elements having a width on the order of one wavelength or less at the ultrasound emission frequency, which is typically 2.25 to 5.0 MHz. This linear array exhibits high sensitivity, short impulse response, and has a wide field of view, and this performance is achieved by the use of impedance matching layers on the front surface of the array and saw cuts from the front surface all the way through the matching layers and piezoelectric ceramic. The matched array is comprised of a large number of transducer element and impedance matching layer units or unit assemblies 10 that are substantially isolated from one another and acoustically uncoupled. Every array unit has a narrow piezoelectric ceramic transducer element 11 which has signal and ground electrodes 12 and 13 on opposite faces and a thickness of one-half wavelength at the emission frequency since the element operates essentially as a half wave resonator. Impedance matching layers 14 and 15 both have a uniform thickness of one-quarter wavelength at the emission frequency and serve as acoustic quarter wave impedance matching transformers. Layer 14 is made of Pyrex® borosilicate glass, or other glass with the required acoustic impedance, and layer 15 is made of Plexiglas® acrylic resin plastic, or other plastic with the proper value of acoustic impedance. Quarter wave transformers 14 and 15 greatly improve energy transfer between the high impedance piezoelectric ceramic and the low impedance of the human body or water (the human body is largely water). The acoustic impedance of PZT (lead zirconate titanate) piezoelectric ceramic is about $30\times10^5$ g/cm$^2$-sec and that of the human body and water is about $1.5 \times 10^5$ g/cm$^2$-sec, and for this transducer material the Pyrex layer has a value of acoustic impedance of $13.1 \times 10^5$ g/cm$^2$-sec and the value for the Plexiglas layer is $3.2 \times 10^5$ g/cm$^2$-sec. These are not ideal impedances for a two-layer system with PZT as determined by the applicable formula, but the impedances of Pyrex and Plexiglas that are given represent an acceptable approximation with readily available materials. The front surface matched array can be made with one or three or more impedance matching layers, but materials with the requisite acoustic impedance values are not so readily available.

A thin layer of pressure sensitive Mylar ® tape 16 (a film of polyethylene terephthalate resin) or some other thin plastic membrane covering is placed over the front surface of the array so that liquid does not infiltrate the slots between the elements. The tape surface is primed so that relatively thick body contacting wear plate 17 adheres easily to it. The wear plate is made of a material in which the longitudinal sound velocity is equal to or less than that in the human body and in which the acoustic impedance for longitudinal sound waves is approximately equal to that of the body. Refraction, if it occurs, enhances the field of view and the wear plate does not change the transducer waveform pulse shape; another property is that it exhibits sufficient mechanical strength to prevent damage to the fragile array structure at nominal body contact. It is preferably made of filled silicone rubber (General Electric Company RTV-28) and another suitable material and more information is given in application Ser. No. 958,655. In operation, the array elements are acoustically uncoupled and free to vibrate independently. The element width at the front of every unit 10 is limited to a dimension small compared to a wavelength; in this case, an incoming acoustic wave at any incident angle passes through wear plate 17 and appears as a local variation in hydrostatic pressure and a subsequent acoustic wave will propagate down the impedance matching "waveguide" comprised of plastic and glass layers 15 and 14 into the piezoelectric ceramic 11. There is insufficient width for the wave phenomenon of refraction to occur, and the small element width at the front surface of plastic layer 15 will thus radiate and receive acoustic energy according to diffraction theory (to first order). The construction and advantages of this front surface matched array are further explained in application Ser. No. 958,654.

Figure 2:
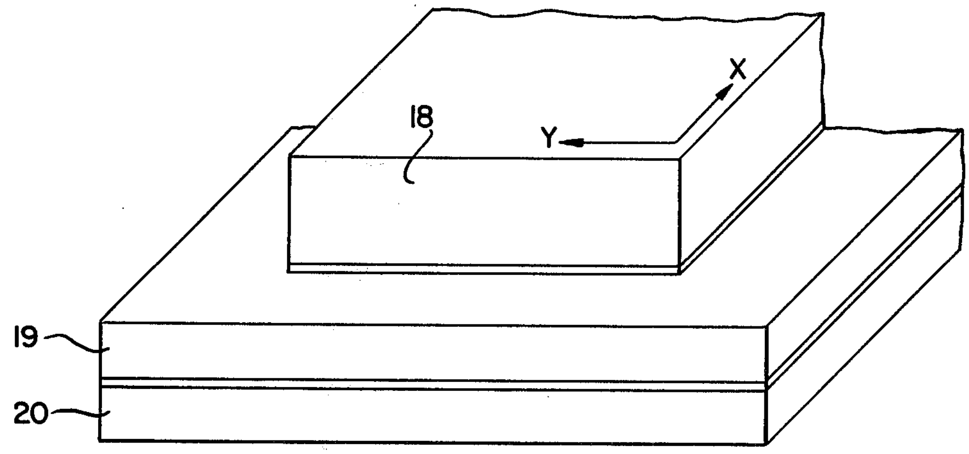
FIGS. 2–4 are partial perspectives of bonded layers of piezoelectric ceramic, glass, and plastic illustrating three steps in the fabrication of the array.

In discussing the fabrication of the front surface matched array, it is convenient to refer to the coordinate system drawn in FIG. 1, where X is along the array in the direction of the width of the elements, Y is in the direction of the length of the elements, and Z is into the human body. FIG. 2 illustrates lamination of a rectangular slab of PZT piezoelectric ceramic 18, which has a thickness of one-half wavelength at the emission frequency and is plated with metal on all six sides, to quarter wavelength impedance matching layers 19 and 20 of glass (Pyrex) and plastic (Plexiglas). The ceramic is either purchased at the correct thickness or is lapped from a slightly thicker slab. The ceramic length in the X direction must be slightly longer than required for the specified number of elements of a designated width, and the ceramic width is approximately 0.100 inch wider than the Y-axis radiative dimension of the array. Following shaping, the ceramic is copper plated with an electroless process and is gold electroplated. The gold plating serves as a foundation for ultrasonic wire bonding and consequently must be of high purity; approximately 0.00005 inch of Temprex S gold (99.99 percent) has been found accepable. The glass is best reduced to the proper thickness by a double face lap or surface grinder, and is a few hundreds of mils and wider than the ceramic. The plastic is best reduced to a uniform quarter wavelength thickness by a double face lap or on a milling machine using a fly cutter; the length and width dimensions are slightly larger than that of the glass. Piezoelectric ceramic slab 18 and plastic layer 20 are bonded to either side of glass layer 19 with Techform Laboratories, Inc. TC-2490 impregnating epoxy. This material has very low viscosity, allowing for a uniform application without air bubbles, and further has excellent adhesion exceeding that of the ceramic/gold interface. Initial wetting of the epoxy to both surfaces improves bond uniformity and slight pressure keeps bond thickness to a minimum. Residual surface roughness of 400–1200 grit improves bond resistance to shear breakage during cutting.

Figure 3:
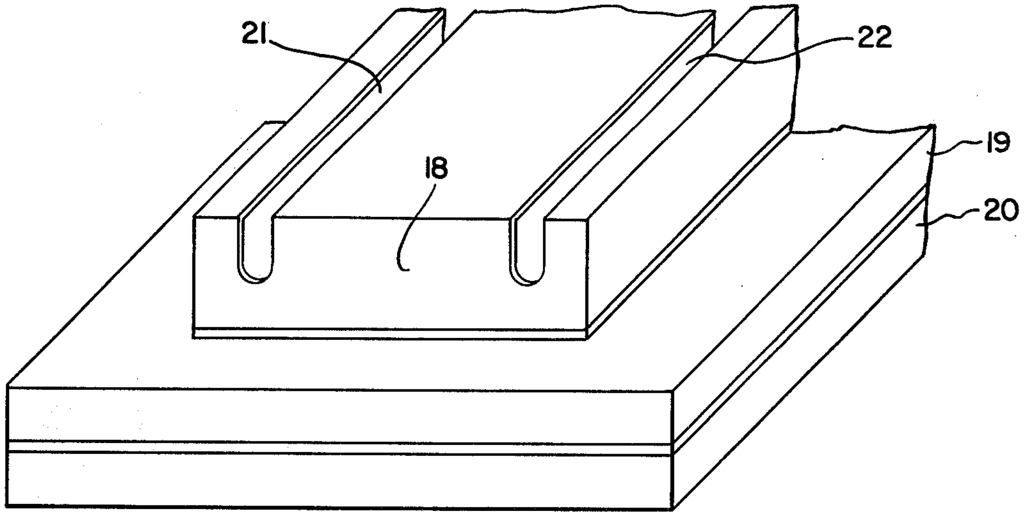

In FIG. 3, two narrow slots 21 and 22 are cut into the upper surface of plated ceramic 18 parallel to the side edges of the slab such that the distance in the Y direction between slots is equal to a designated element radiative length. These slots break the continuous gold surface around the ceramic and small flats are left along the side edges to provide electrical contact points for making ground connections. The slot depth is approximately one-half the ceramic thickness and they may be cut on a surface grinder with a diamond or carborundum cutoff wheel. Element radiative length depends upon the emission frequency and becomes shorter as the emission frequency becomes higher.

Figure 4:
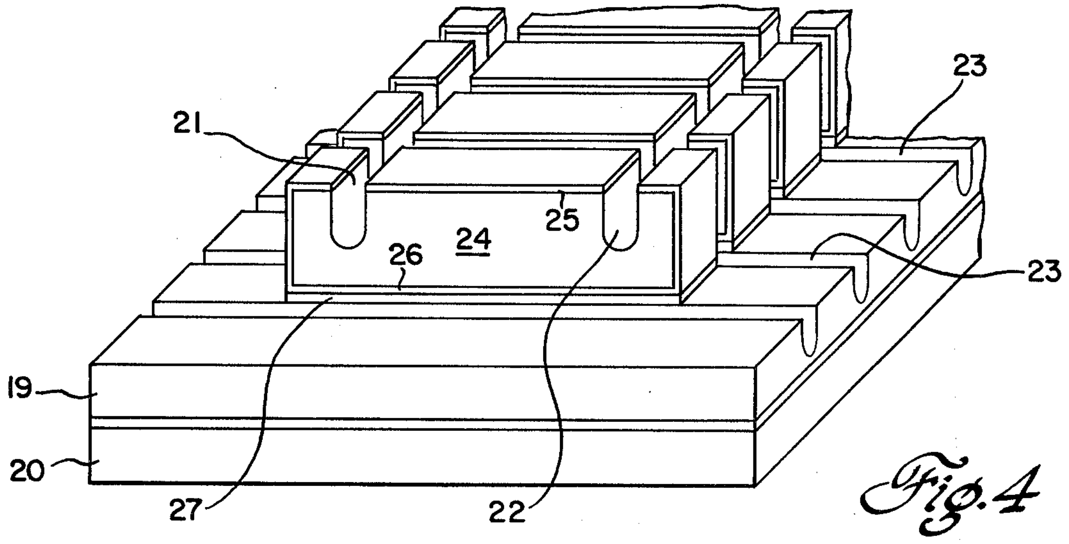

The first cutting of the array elements, FIG. 4, is a series of saw cuts 23 parallel to the end edges of the plated ceramic slab at a spacing equal to a designated element width, plus saw kerf; these cuts pass completely through the ceramic and about half way through glass layer 19. This cutting delineates a linear array of transducer elements 24, each having a signal electrode 25 between slots 21 and 22 and a wrap-around ground electrode 26. In this figure, the bonding layer is indicated at 27. The residual glass and plastic layer 20 keep the array structure intact until remounted on a permanent frame. A semiconductor dicing saw can be used and the saw cut widths are typically 0.0010 inch to 0.0035 inch, depending on the type of blade.

A common ground connection is made to every element wraparound ground electrode and separate flying lead connections are made to the signal electrodes of the elements. Referring to FIGS. 5 and 6, a hollow rectangular ground plane circuit board 28 is bonded to the edges of glass layer 19 surrounding the linear array of elements 24. The surface of board 28 has a continuous ground bus conductive pattern 29 around its inner edge. An insulating ground plane spacer 31 (FIG. 7) is bonded with adhesive epoxy to the outer edges of ground plane board 28 to allow space for conducting epoxy 30 and to support a signal printed circuit board 32 which projects over the ends of elements 24 from both sides. A conductive filler material 30 (such as Tra-Con Inc. No. 2902 silver loaded epoxy) is squeezed between ground plane board 28 and spacer 31 and the ends of plated elements 24, establishing essentially continuous electrical paths along the two sides of the array and connecting ground bus 29 with the wrap-around ground electrode 26 of every element. Care must be taken so that capillary action does not draw the epoxy into the cuts between the transducer elements, subsequently shorting them out.

Prior to mounting the signal board, depicted in FIG. 8, excess silver filled epoxy is lapped to produce a flat surface parallel to the top surface of the spacer 31. The signal board has an elongated central slot and at least one printed conductive pattern 33 for every element. By careful design of the contact pads, this circuit board can be made to line up with the appropriate elements of the transducer array, thus minimizing the length of the flying leads. The fan out of leads on signal board 32 is designed to provide maximum distance between solder donuts for wires to the connectors. Signal board 32 has the same quality gold electroplated over copper as does the ceramic. Individual flying leads 34, one or two for every element, are ultrasonically bonded to signal electrodes 25 and to contact pads on signal board 32 lying along the sides of the central slot. A commercially available ultrasonic wire bonding machine may be used and caution is taken to mount the circuit board securely so that no flexing occurs during the bonding process. The stage of the ultrasonic wire bonder with its manipulator controls provides a convenient aid in positioning the wires and attenuates manual motions so that it is fairly simple to make connections at the right places.

Figure 10:
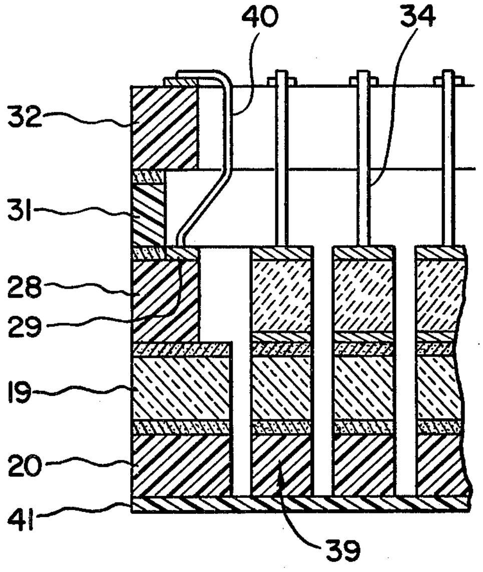
FIG. 10 is a partial cross-section through the array pallet in FIG. 5 illustrating details of the common ground connection.
Figure 11:
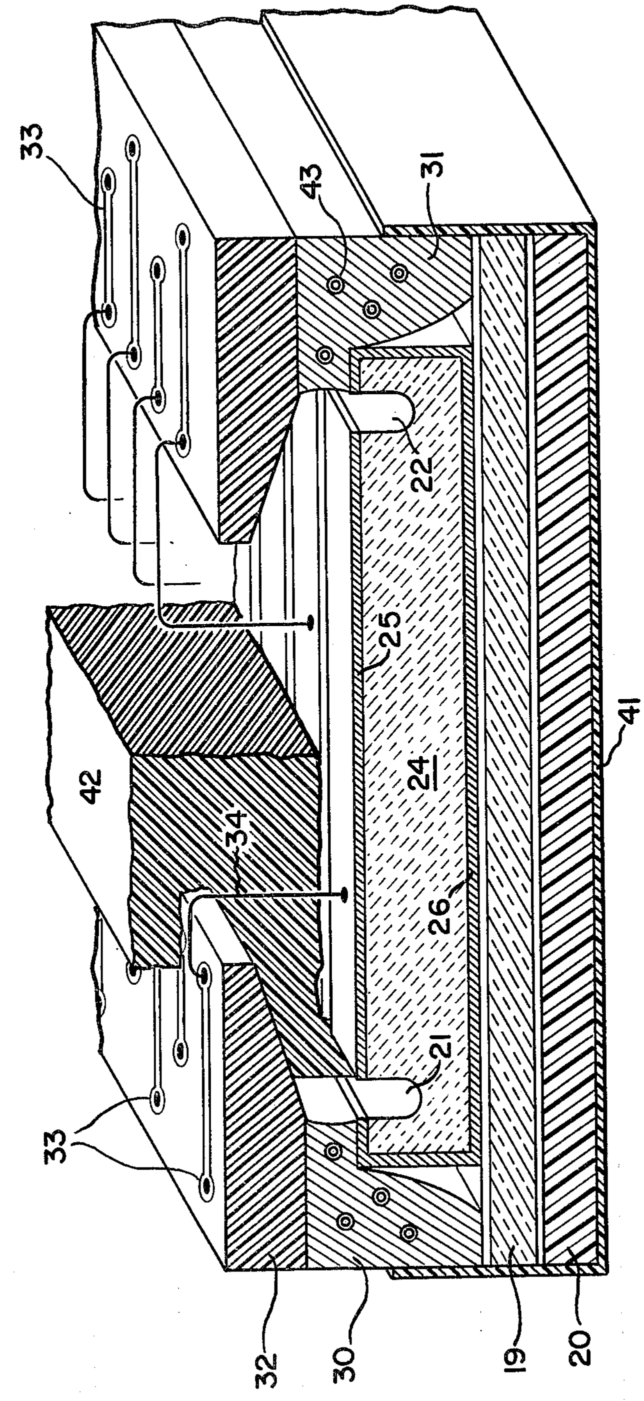
FIG. 11 is a partial perspective of one end of an epoxy backed array pallet.

The embodiment of the front surface matched array assembly or array pallet in FIG. 5 is an air backed array. In this case, an insulating spacer 35 (also see FIG. 9) is bonded to signal board 32 so as to encircle the central slot, through which flying leads 34 pass, and provide a mounting for a solid plastic cap 36. The cap structure prevents breakage of the flying leads. The large tabs at either end of signal board 32 and top spacer 35 represent mounting flanges for the array on a saw pallet for the final cutting of the ceramic and matching layer laminate. As indicated by dashed lines in FIGS. 8 and 9, these tabs 37 are later removed. Using the same size blades as for first cuts 23, aligned second cuts 38 (FIG. 5) are made from the front surface through plastic layer 20 and the remainder of glass layer 19 to completely separate the bonded together element and matching layer units 39. A light polishing of the plastic front surface makes possible optical alignment of the saw over the previous partial cuts. The fully independent units 39 are now held in place only by the adhesive between glass layer 19 and ground plane board 28, hardened conductive epoxy 30, and the ground plane board. A step normally performed before the second sawing and before signal lead wire bonding is to complete connection of a ground wire or wires from ground plane board 28 to a contact pad on signal board 32. FIG. 10 is a cross section taken in the X-Z plane and shows one end of the array assembly. A ground wire 40 is soldered to ground plane bus 29 and is passed by the edge of signal board 32 and soldered to a connector contact pad on the top surface of the board. There is a ground wire connection at both ends of the array pallet. Assembly of the array is completed by pulling one-quarter or one-half mil thick Mylar pressure sensitive tape 41 (as shown in FIG. 11) over the cut front surface of plastic layer 20. This configuration is suitable for water tank testing but many applications including medical diagnostic examinations require the addition of a wear plate to the front surface of the array.

The preferred embodiment of the invention shown in FIG. 11 is an epoxy backed array, it being understood that another appropriate acoustic damping material may be substituted for epoxy. The epoxy backfill is indicated generally at 42 and completely fills the space between the array of elements 24 and signal printed circuit board 32. The side of signal board 32 facing the ceramic is beveled adjacent to the central slot to prevent acoustic reflections directly back to the ceramic, thus setting up a resonant cavity at an undesired frequency. The array pallet otherwise is the same as in FIG. 5 and is fabricated in similar fashion with the exception that opposing sides of the assembly are trimmed off after signal lead bonding and the epoxy backfill operation to reduce the overall dimension in the Y direction or in the direction of the length of the elements. Small array dimensions are desirable for making many medical ultrasonic examinations. Reinforcing wires 43 in conducting epoxy 30 give added mechanical strength. The addition of epoxy backing 42 instead of an air backing substantially reduces the transducer element main shock excitation ring down noise. As is well known, the transducer elements are excited by applying a high voltage between the signal electrode 25 and ground electrode 26 of a selected element 24. A problem with a specific air backed array implementation that has been described is that after the main shock excitation there may be a coherent oscillation which generates noise having a primary frequency component within the pass band of the receiver causing it to be processed as true data. Since the gain of the system amplifiers increases with time after the trasmit pulse, the decaying coherent noise from the transmit pulse is amplified to a level comparable to echoes from the body. Acoustically nonabsorbing components of the transducer head are presumed to be responsible for this long lasting noise and resulting image degradation. Backing the transducer array with an acoustically lossy material significantly reduces any persistent noise in the transducer array, and by chosing a material with a low acoustic impedance as compared to that of the piezoelectric ceramic, the sensitivity loss can be minimized. On such material is Techform Laboratories Inc. EA 700 Adehsive Epoxy, which has an acoustic impedance of approximately $3\times10^5$ g/cm$^2$-sec. Another step that can be taken to reduce coherent noise is to use acoustically absorbing materials in the transducer head, in particular an absorbing connector frame rather than a metal frame.

Backing the transducer array with epoxy fill 42 requires additional fabrication precautions. First, one side of signal printed circuit board 32 is beveled to prevent acoustic reflections back to the elements and the setting up of a resonant cavity. Second, the ultrasonic wire bonds between flying leads 34 and signal electrodes 25 and between the flying leads and conductive patterns 33 on signal circuit board 32 need additional support to prevent shearing by the curing, contracting epoxy. These flying leads are made of gold or possibly aluminum. A small amount of the back fill epoxy is placed on the ceramic covering the wire bond areas, and a small amount of conducting epoxy is placed on the wire bond areas on signal board 32. One side of the array is flooded with back fill epoxy, then the other side, and finally the central region. Another precaution is the application of as little heat as possible when soldering the connector wires (FIG. 12) to signal board 32, because too much heat results in differential thermal expansion and breaks the wire bond.

Many variations are possible in the sequence of steps for fabricating the epoxy backed array but the preferred sequence, to review, is as follows: A half wavelength of plated piezoelectric ceramic 18 is bonded to quarter wavelengths of Pyrex 19 and Plexiglas 20; excessive laminate is trimed off; narrow slots 21 and 22 are cut into the plated ceramic; first saw cuts 23 are made through the plated ceramic into the Pyrex; ground plane printed circuit board 28 and spacer 31 are bonded to encircle the separate elements; ground wires 40 are soldered to either end of ground bus 29; conducting epoxy 30 is deposited to bridge the gap at the sides between ground bus 29 and the contact flats of ground electrodes 26; signal printed circuit board 32 and spacer 35 are bonded; the other ends of ground wires 40 are soldered to signal board 32; signal flying leads 34 are ultrasonically bonded; the space between elements 24 and signal board 32 is filled with epoxy 42 which also covers the tops of flying leads; the array is trimmed off to reduce the Y dimension; second saw cuts 38 are made through Plexiglas 20 and the remainder of Pyrex 19; and Mylar pressure sensitive tape 41 is attached to the front surface of Plexiglas 20.

Figure 12:
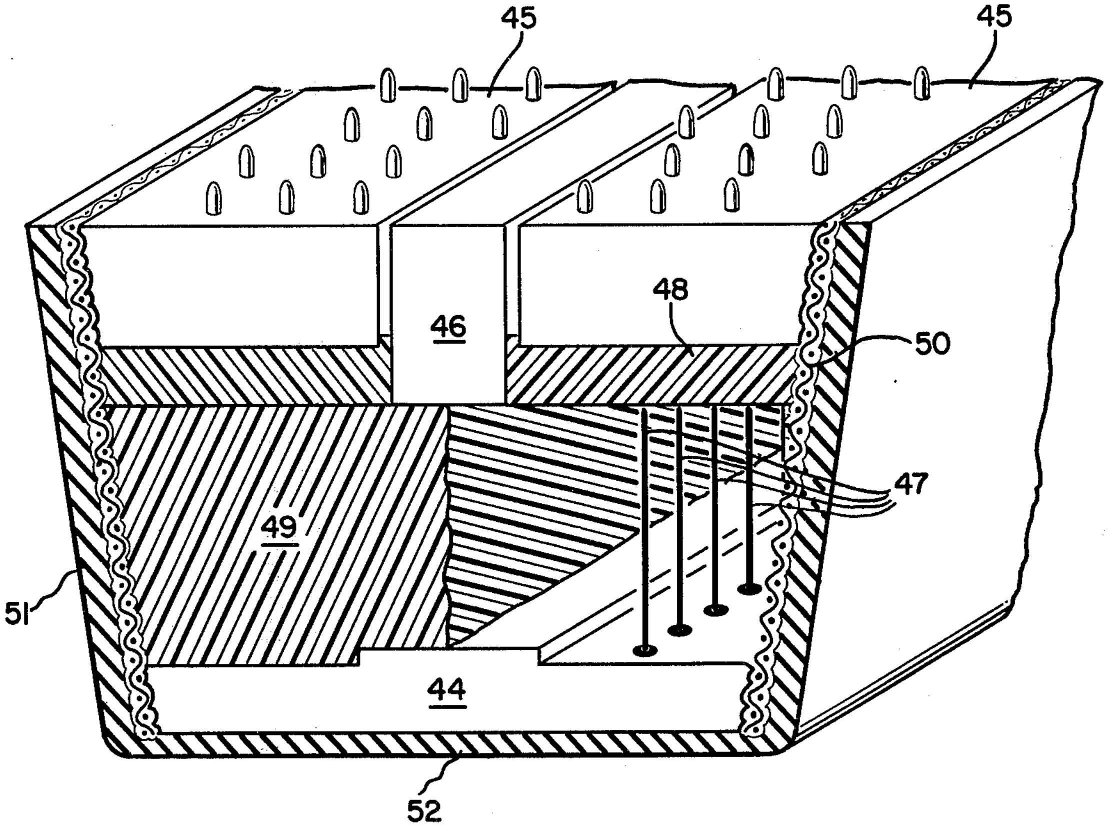
FIG. 12 is an interior view of one end of a transducer head with the array pallet of FIG. 11.

FIG. 12 is an interior view of the transducer head with an epoxy backed array pallet 44 such as is depicted in FIG. 11. The backfilling of the transducer array with epoxy has the additional benefit of making the device physically stronger and consequencely safer for body contact, but a relatively large mass of epoxy is needed to accomplish the function of significantly reducing transducer main shock excitation ring down noise. Thus, it is necessary to substantially fill the space between array pallet 44 and multi-pin connector packages 45 with epoxy. If another acoustical lossy material is substituted for epoxy, the same material is used throughout.

Upright struts and connector frames 46, shown only partially in the drawing, are made of acoustically absorbing materials and are supported on array pallet 44. Multi-pin connectors 45 are purchased items; the socket portion of the connector is part of the cable connecting the ultrasonic probe to the remainder of the sector scan imaging system. Connector wires 47 are soldered to contact donuts on signal board 32 and to the bottom of the connector packages. The distance between array pallet 44 and connectors 45 is relatively large, on the order of 1 centimeter or so, as compared to the overall Z dimension of the pallet. The ends of connector wires 47 next to connector packages 45 are covered with purchased silicone sealant 48 to allow for a small amount of movement, and the remainder of the space between array pallet 44 and silicone 48 is completely filled with epoxy 49 (Techform EA 700 Adhesive Epoxy). After the epxoy cures, a wire screen EMI (electromagnetic interference) shield 50 is placed around the assembly and the whole is encapsulated and filled with silicone rubber 51 (General Electric Company RTV-28). Wear plate 52 at the front of the array is made of the same material and is produced at the same time.

The assembly and electrical connection technique that has been described for ultrasonic transducer arrays is suitable for making arrays with front surface matching layers, having a variable number of independent elements (30–120, for instance), capable of operating at different frequencies (2.25, 3.5, and 5.0 MHz, for example), and provided with a front surface coating and housing for mechanical strength and electrical safety.

While the invention has been particularly shown and described with reference to several preferred embodiments thereof, it will be understood by those skilled in the art that various changes in form and details may be made therein without departing from the spirit and scope of the invention.

We claim:

1. The method of assembling a front surface matched ultrasonic transducer array operative to generate ultrasound pulses at an emission frequency and to detect echoes comprising the steps of:

plating with metal at least the major surfaces and two side edges of a rectangular slab of piezoelectric ceramic having a thickness of one-half wavelength at the emission frequency, and bonding to the plated ceramic at least one impedance matching layer having a thickness of one-quarter wavelength at the emission frequency, cutting slots in the plated ceramic near the side edges such that the distance between slots is equal to a designated element radiative length, making first cuts parallel to the end edges of the plated ceramic at a spacing equal to a designated element width and which extend completely through the ceramic and partially into the matching layer to thereby delineate an array of elements each having a signal electrode and a wrap-around ground electrode, fabricating a flying lead connection to the signal electrode of every element and a common connection to the ground electrodes, making second cuts through the remainder of the matching layer which are aligned with the first cuts to completely separate the bonded together element and matching layer units, and attaching a continuous covering to the front surface of the matching layer.

2. The method of claim 1 and the additional step of depositing a relatively large mass of acoustically lossy material to cover the backs of the elements, said material having an acoustic impedance that is low compared to that of the piezoelectric ceramic.

3. The method of claim 1 wherein the step of fabricating flying lead signal connections and ground electrode connections is performed by bonding a ground plane printed circuit board to the matching layer and making a connection between every ground electrode and a common bus conductive pattern on the ground plane board, mounting a signal printed circuit board to be supported by the ground plane board and project over the elements, connecting a flying lead between every signal electrode and a conductive pattern on said signal board, and connecting the common ground bus to a conductive pattern on said signal board.

4. The method of claim 3 wherein the signal board projects over the elements from both sides and has a beveled surface facing the elements, and the additional step of filling at least the space between the elements and signal board with an acoustically lossy material.

5. The method of claim 4 and the additional step of trimming off opposing sides of the assembly to reduce the overall dimension in the direction of the length of the elements.

6. The method of claim 4 and the additional steps of mounting a connector package above the signal board and connecting wires between the signal board conductive patterns and said connector, and filling in at least a substantial part of the space between the signal board and connector package with said acoustically lossy material.

7. The method of claim 3 wherein the signal board projects over the elements from both sides and the additional step of securing a cap to the signal board which covers the signal flying leads.

8. The method of claim 1 wherein the step of fabricating flying lead signal connections and ground electrode connections is performed by bonding a ground plane printed circuit board to the matching layer and depositing a conductive filler to electrically connect every ground electrode to a common bus conductive pattern on the ground plane board, mounting a signal printed circuit board to be supported by the ground plane board and project over the elements from both sides, ultrasonically bonding a flying lead between every signal electrode and conductive patterns on the signal board, connecting a ground wire between the ground plane common bus and a signal board conductive pattern, and depositing epoxy to at least fill the space between the backs of the elements and said signal board, said epoxy having an acoustic impedance that is low compared to that of the piezoelectric ceramic.

9. The method of claim 8 and the additional step of trimming the assembly to reduce the overall dimension in the direction of the length of the elements.

10. The method of assembling a front matched surface ultrasonic transducer array operative to generate ultrasound pulses at an emission frequency and to detect echoes comprising the steps of:

plating with metal all the surfaces of a rectangular slab of piezoelectric ceramic having a thickness of one half wavelength at the emission frequency, and bonding to the plated ceramic and to one another first and second impedance matching layers each having a thickness of one-quarter wavelength at the emission frequency, cutting two slots in the plated ceramic parallel to the side edges such that the distance between slots is equal to a designated element radiative length, making first cuts parallel to the end edges of the plated ceramic at a spacing equal to a designated element width and which extend completely through the ceramic and partially into one matching layer to thereby delineate a separate signal electrode on each element and a wrap-around ground electrode on each element, bonding a ground plane printed circuit board to the first matching layer and depositing conductive filler material to electrically connect every ground electrode and a common bus conductive pattern on the ground plane board, supporting a signal printed circuit board on said ground plane board so as to project over the elements from both sides and providing a flying lead electrical connection between every signal electrode and conductive patterns on the signal board and also a ground wire connecting the ground plane board conductive pattern to a signal board conductive pattern, making second cuts through the matching layers which are aligned with the first cuts to completely separate the bonded together element and matching layer units, and attaching a continuous covering to the front surface of the matching layers.

11. The method of claim 10 and the step of filling at least the space between the backs of the elements and said signal board with an acoustically lossy material which has a low acoustic impedance as compared to that of the piezoelectric ceramic.

12. The method of claim 11 and the step of mounting a connector package above the signal board and connecting wires between the signal board conductive patterns and said connector, and filling at least a substantial portion of the space between said signal board and connector package with said acoustically lossy material.

* * * * *